(12) United States Patent
Drury et al.

(10) Patent No.: US 6,400,024 B1
(45) Date of Patent: *Jun. 4, 2002

(54) METHOD OF PROVIDING A VERTICAL INTERCONNECT BETWEEN THIN FILM MICROELECTRONIC DEVICES

(75) Inventors: Christopher J. Drury; Cornelius M. J. Mutsaers; Cornelis M. Hart; Dagobert M. De Leeuw, all of Eindhoven (NL)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 39 days.

(21) Appl. No.: 09/135,193

(22) Filed: Aug. 17, 1998

(30) Foreign Application Priority Data

Aug. 22, 1997 (EP) .............................. 97202589

(51) Int. Cl.⁷ .............................. H01L 29/40
(52) U.S. Cl. ................. 257/759; 257/741; 257/773; 438/610; 438/618; 438/623; 29/849
(58) Field of Search ................. 438/610, 623, 438/618; 29/849, 853; 257/759, 40, 410, 642, 289, 785, 741, 746, 747, 748, 773, 776, 781

(56) References Cited

U.S. PATENT DOCUMENTS

| 5,131,141 A | * | 7/1992 | Kawaguchi .................. 29/853 |
| 5,689,428 A | * | 11/1997 | Sauerbrey et al. |
| 5,942,374 A | * | 8/1999 | Smayling |
| 6,133,835 A | * | 10/2000 | DeLeeuw et al. ........ 340/572.5 |

FOREIGN PATENT DOCUMENTS

| JP | 5299514 A | 11/1993 | ......... H01L/21/768 |
| JP | 5-299514 A | 11/1993 | ......... H01L/21/90 |

OTHER PUBLICATIONS

"VLSI Technology", ed. Sze, McGraw–Hill (1983), p. 447.
"All Polymer Field–Effect Transistor Realized by Printing Techniques", by Garnier et al, Science, vol. 265, Sep. 16, 1994.

* cited by examiner

Primary Examiner—Caridad Everhart
(74) Attorney, Agent, or Firm—Ernestine C. Bartlett

(57) ABSTRACT

A simple and reliable method of providing a vertical interconnect between thin-film microelectronic devices is provided. In said method, a tool tip is used to make a notch in a vertical interconnect area of two organic electrically conducting areas separated from each other by an organic electrically insulating area. The method is used in the manufacture of integrated circuits consisting substantially of organic materials.

10 Claims, 3 Drawing Sheets

METHOD OF PROVIDING A VERTICAL INTERCONNECT BETWEEN THIN FILM MICROELECTRONIC DEVICES

BACKGROUND OF THE INVENTION

The invention relates to a method of providing a vertical interconnect between a first and a second thin-film microelectronic device.

The invention further relates to an integrated circuit.

If a plurality of thin-film microelectronic devices, for example a plurality of field-effect transistors, is to constitute an IC, interconnects between these devices are to be provided. An interconnect provides an electrical connection between a terminal of a first and a second thin-film microelectronic device. Sometimes, it is necessary to provide an interconnect which extends through a stack of layers. An interconnect of this type is referred to as a vertical interconnect or, in short, a via.

In silicon-based IC technology, a vertical interconnect is made by photolithographically defining a contact window, etching so as to obtain a contact hole and, subsequently, filling the contact hole by depositing metal (see e.g. VLSI Technology, ed. Sze, McGraw-Hill (1983), p 447).

In the field of microelectronics based on devices consisting substantially of organic materials, such devices being disclosed, for example, by Garnier et al. in Science, vol. 265 (1994), pp. 1684–1686, a method of providing a vertical interconnect between thin film devices, let alone a method less elaborate than the method mentioned hereinabove, is not known. Microelectronics based on organic materials may be effectively used in those applications where the use of silicon-based technology is prohibitively expensive.

SUMMARY OF THE INVENTION

It is an objective of the invention, inter alia, to provide a method of providing a vertical interconnect between a first and a second thin-film device, in particular between devices consisting substantially of organic materials. The method is to be simple and reliable.

This objective is achieved by a method of providing a vertical interconnect between a first and a second thin-film microelectronic device, said method comprising the steps of:
    providing a vertical interconnect area,
        said vertical interconnect area being an area of overlap of a stack of a first organic electrically conducting area, an organic electrically insulating area and a second organic electrically conducting area,
        said first organic electrically conducting area being electrically connected to a terminal of said first microelectronic device,
        said second organic electrically conducting area being electrically connected to a terminal of said second microelectronic device, and
    notching the vertical interconnect area using a tool tip, thereby forming the vertical interconnect.

Although the details as to how and why the method works are unclear, the method is found to be simple and very reliable. Typically, it is possible to make 118 vias, each via having a contact resistance of 3 kΩ on average, in a single run without a single failure. The method does not involve any photolithographic step, which makes it less elaborate than methods known from silicon-based IC technology. Notching does not require a large force.

The method appears to be effective, substantially irrespective of the material properties of the organic materials used. In particular, the method appears still effective if the insulating area is far less deformable than both the first and second electrically conducting areas, as is the case if a layer of cross-linked polyvinylphenol is disposed between layers of a conducting polyaniline.

It is indeed surprising that the method is effective in providing a vertical interconnect. After all, one would expect that the presence of a notch implies the absence of (electrically conducting) matter, whereas the presence of a vertical interconnect requires the presence of electrically conducting matter.

It has been found that the choice of the insulating material for the manufacture of the insulating area is not critical. Examples include organic electrically insulating materials known per se. Good results have been obtained with a polyvinylalcohol or a polyvinylphenol.

The choice of the organic electrically conducting material used to form the first and second electrically conducting areas is not critical either. Suitable examples include heavily doped semiconducting polymers (oligomers) known per se, such as a polyaniline, a polythiophene, a polypyrrole, a polyphenylene, a polyphenylenevinylene, or, in particular, a poly-3,4-ethylenedioxythiophene.

For the supporting substrate use can suitably be made of synthetic resins, such as a polyamide. Glass and silica substrates can also be suitably used.

A suitable surface area of the vertical interconnect area is, for example, 20 μm by 20 μm. Smaller surface areas, such as 100 μm², are also possible.

A suitable thickness of the stack constituting the vertical interconnect area is 2 μm or less. A larger thickness, such as 5 μm or 20 μm, is possible but leads to an increase of the force needed to drive in the tool tip. Notching is less accurate if a larger force is applied.

Notching the vertical interconnect area involves positioning the tool tip opposite the vertical interconnect area, driving in the tool tip and retracting the tool tip from the vertical interconnect area.

As a result of the presence of the notch, the contact resistance of the vertical interconnect area drops dramatically, i.e, a vertical interconnect is formed.

The extent of notching required in order to form a vertical interconnect can be determined by a simple empirical procedure, in which, for example, the force used to drive in the tool tip is varied.

The actual shape of the notch, for example its diameter at the top or the extent to which it is driven in, depends on many parameters, such as the amount of force applied to the tool tip, the angle of attack of the tool tip, the shape of the tool tip and the nature of the supporting surface. For example, if the tool tip is needle-shaped and attacks the via (the term via is short for both vertical interconnect and vertical interconnect area) at substantially a right angle, the notch is shaped like a crater. If lateral movement of the tool tip occurs during notching, the notch takes the form of a trench or a set of scratches.

By simply expanding the stack comprising the vertical interconnect area with further electrically conducting areas and/or further insulating areas, the method can be used to provide multilevel vertical interconnects.

It is noted that in an English-language abstract of the Japanese Patent Application JP-A-5-299514, a method of providing a via using a tool tip is disclosed. It is not apparent from said document that the known method relates to a method of providing a via between thin-film microelectronic devices, let alone thin-film microelectronic devices consisting substantially of organic materials. Furthermore, the obtuse tool tip does not notch the vertical interconnect area but is used as a pressing member for pressing the conducting tracks against each other. Pressing requires large forces.

In order to minimize the pressure exerted on areas outside the via, which may lead to undesirable (permanent) deformation of said areas, an attack at a more or less right angle from horizontal is preferred.

In order to reduce the force needed to drive in the tool tip, a tapered tool tip is preferred. In order to avoid excessive pressure being exerted on areas outside the via, the tapered section is preferably longer than the thickness of the via and should have an included angle which is acute or, preferably, less than 20 degrees.

The tool tip may be wedge-shaped or needle-shaped. Probe tips used for probing circuits on silicon chips are particularly effective. Such probe tips are durable, available in many varieties and have a well-defined geometry.

In order to reduce wear, hard and wear-resistant tool tips, such as tungsten carbide tool tips, may be used.

A preferred embodiment of the method in accordance with the invention is characterized in that a tapered tool tip is used having a tip radius between 0.1 $\mu$m and 5.0 $\mu$m.

Although tool tips with a tip radius of 10 $\mu$m, 25 $\mu$m or 50 $\mu$m have been used successfully, tool tips having a tip radius smaller than 5.0 $\mu$m are found to be more reliable. Tool tips smaller than 0.1 $\mu$m break easily. The tip radius is defined as the radius of curvature at the point of the tip.

In another preferred embodiment of the method in accordance with the invention, the first and second organic electrically conducting areas comprise an electrically conducting polyaniline. By using electrically conducting polyaniline, the conductivity of which typically is 10 to 100 S/cm, a via having a contact resistance as low as 3 k$\Omega$ can be made. For many applications, this resistance is sufficiently small. For example, if the via interconnects field-effect transistors consisting substantially of organic materials, the current flowing through the via will typically be in the order of $10^{-9}$ to $10^{-6}$ A. Given a resistance of 3 k$\Omega$, the resulting voltage drop across the via is negligible.

Notching may be performed manually using a hand-held tool, but if many, for example more than 30, vias are to be made, notching is preferably done using mechanized (automated) equipment. At least in the case of small series or one-off applications, probe stations used to test circuits on silicon chips are convenient.

Many vias can be made simply one after the other. Throughput can be increased, however, if the method is modified in that a tool comprising a plurality of tool tips is used, thus allowing a plurality of vias to be made simultaneously. An example of such a tool is a metal plate etched in accordance with a desired pattern so as to obtain a plurality of pins. It is to be noted that the force required to notch the vias is apparently proportional to the number of vias to be made simultaneously.

The method is to provide a vertical interconnect between a first and a second thin-film microelectronic device. Obviously, this can only be done if the first and second electrically conducting areas of the vertical interconnect area are connected, respectively, to the first and second thin-film microelectronic device. Although the method can be suitably used in conjunction with any type of organic thin-film microelectronic device, the method is particularly effective in forming a vertical interconnect between field-effect transistors consisting substantially of organic materials.

The method in accordance with the invention is sufficiently reliable so as to allow integrated circuits to be made using said method.

The invention therefore further relates to an integrated circuit which, in accordance with the invention, is characterized in that the integrated circuit comprises at least one vertical interconnect obtainable by the method in accordance with the invention.

In a preferred embodiment, the integrated circuit substantially consists of organic materials. As a result of the low cost of organic materials and their ease of processing, an integrated circuit consisting substantially of organic materials, in short an organic IC, can be manufactured at a much lower cost than a silicon-based IC.

In a particularly preferred embodiment, the thin-film devices are part of the stack of layers used to form the vertical interconnect area. In this case, a stack comprising only four layers, two of which are patterned, is sufficient to provide an IC.

A thin-film microelectronic device which may be conveniently accommodated by such a four-layered stack is a field-effect transistor.

Examples of circuits which can be successfully implemented in this manner include logic gates, such as an invertor, a NAND gate, a NOR gate, and an AND gate as well as combinations thereof, such as flip flops, frequency dividers and ring oscillators.

These and other aspects of the invention will be apparent from and elucidated with reference to the embodiments described hereinafter.

DESCRIPTION OF THE PREFERRED EMBODIMENTS

Exemplary Embodiment 1

Figure 1:
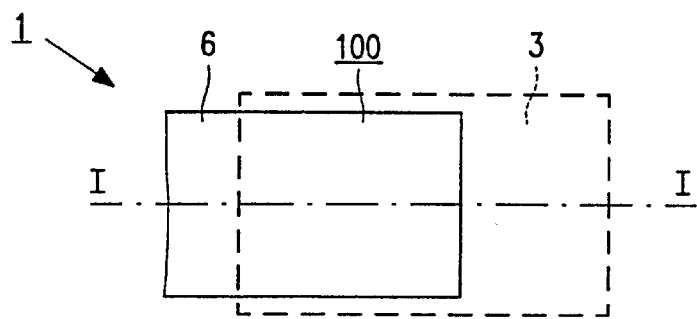
FIGS. 1 and 2 schematically show a transparent plan view of a vertical interconnect area, respectively, before and after applying the method in accordance with the invention, FIGS. 3 and 4 schematically show a cross-sectional view taken on, respectively, the line I—I in FIG. 1 and the line II—II in FIG. 2, FIG. 5 schematically shows a transparent plan view of a repeating unit of a chain of vertical interconnect areas suitable for use in the method in accordance with the invention.
Figure 2:
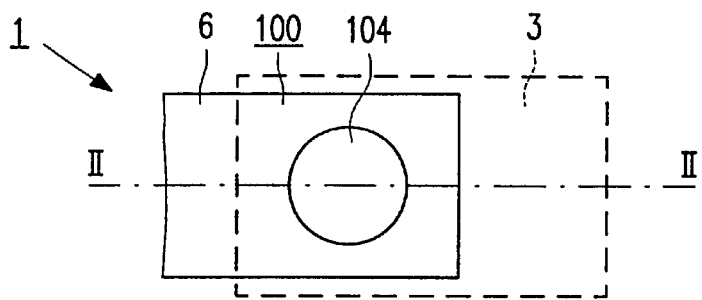

FIGS. 1 and 2 schematically show a transparent plan view of a vertical interconnect area, indicated by the reference sign 100, respectively before and after applying the method in accordance with the invention.

Figure 3:
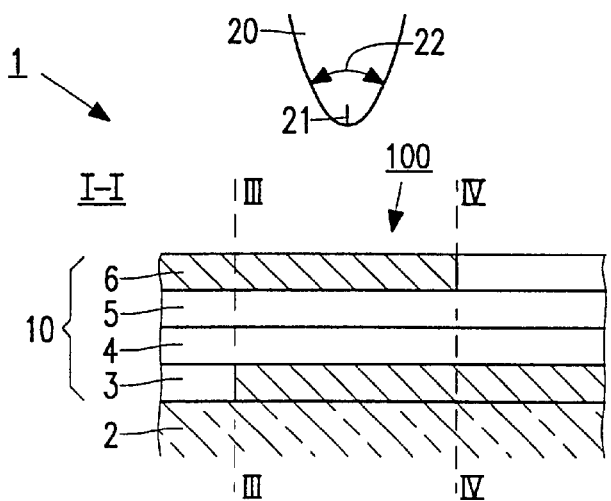
Figure 4:
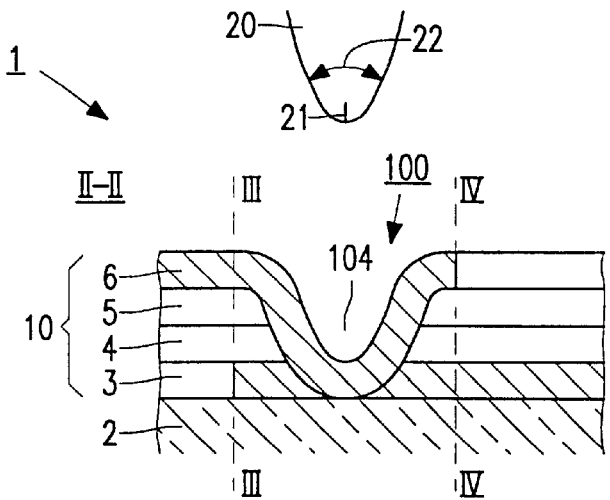

The vertical interconnect area 100 is part of a thin-film laminate 1. The laminate 1 comprises a stack, indicated by the reference sign 10 in FIG. 3, secured on a substrate 2. The stack 10 comprises a first organic electrically conducting area 3, an organic electrically insulating area 5 and a second organic electrically conducting area 6. Although it is by no means essential, the stack 10 further comprises an organic semiconducting area 4. The first organic electrically conducting area 3 is electrically connected to a terminal of a first thin-film microelectronic device (not shown), the second organic electrically conducting area 6 is electrically connected to a terminal of a second thin-film microelectronic device (also not shown). The vertical interconnect area 100 is the area of overlap of the stack 10, that is, it is the area delimited by the lines III—III and IV—IV shown in FIGS. 3 and 4. FIGS. 3 and 4 further show a tapered tool tip 20 having a tip radius 21 and included angle 22. FIG. 4 shows a notch 104 obtained by notching the vertical interconnect area 100 with the tool tip 20.

It is noted that, since the exact shape of the areas around the notch is not known, FIG. 4 merely gives a schematic indication of a possible shape. All that can be said with certainty is that photographs taken in plan view of vertical interconnect areas which have been treated with the tool tip prove that the tool tip has indeed notched the vertical interconnect areas. Common sense seems to indicate that the notch 104 should at least be so deep that it penetrates the electrically conducting area 3.

FIGS. 1 through 4 serve to elucidate the method in accordance with the invention. An example of the method in accordance with the invention reads as follows:
1) Providing the Vertical Interconnect Area 100:
A) Preparation of a Conducting Polyaniline Solution Emeraldine base polyaniline (Neste) (0.7 g, 7.7 mmol) and camphor sulphonic acid (Janssen) (0.8 g, 3.4 mmol) are ground together with a mortar and pestle in a nitrogen-filled glove box. The mixture is split in two and placed in two 30 ml polyethylene bottles each containing 30 g m-cresol and three agate balls (0.9 mm diameter). These are placed in a shaker (Retsch MM2) operating at full speed for 14 to 18 hours. The contents of the bottles are combined and then sonified for 5 minutes. The mixture is cooled to room temperature and then the sonification process is repeated. This mixture is then centrifuged at 12500 rpm for 2 hours. The conducting polyaniline solution thus obtained is pipetted off leaving any solids on the bottom of the centrifuge tubes.
B) Preparation of a Precursor Polythienylenevinylene Solution A quantity of 10.0 g (0.028 mol) 2,5-thienylenedimethylenebis(tetrahydrothiophenium chloride) (supplier Syncom BV, Groningen, The Netherlands) is dissolved in 100 ml of a 2/1 v/v mixture of methanol and demineralized, water and cooled to −22° C. in a nitrogen environment. Pentane (120 ml) is added and then sodium hydroxide (1.07 g, 0.0268 mol) dissolved in 100 ml of a 2/1 v/v mixture of methanol and demineralized water and cooled to −22° C. is added instantaneously to the stirred monomer solution kept at −22° C. That temperature is maintained for 2 hours and the mixture is then neutralized fusing 1.5 ml 2 N HCl. After having stored the mixture in a flask for 2 days, the liquid part is decanted off, and the remaining solid, the precursor poly(2,5-thienylenevinylene) is washed three times with methanol and dried in a vacuum. The precursor polymer is then dissolved in dichloromethane and concentrated to obtain a solution which after filtration (Millex LS 5 $\mu$m and Millex SR 0.5 $\mu$m) would give a 0.05 $\mu$m film if spin-coated (3 s/500 rpm, 7 s/1000 rpm) on a glass substrate.
C) Manufacturing the Laminate 1:

A 65 $\mu$m polyamide foil (supplier Sellotape) is secured on a 3 inch silicon wafer. A solution of 10.0 g (0.083 mol) polyvinylphenol (Polysciences Inc., cat #6527) and 1.625 g (4.17 mmol) hexamethoxymethylenemelamine (Cymel 300 from Cyanamid) in 36 g propylene glycol methyl ether acetate (Aldrich) is spin-coated (3 s/500 rpm, 27 s/2000 rpm) onto the foil and then dried at 110° C. for 1 min on a hot plate. Cross-linking at 125° C. in a nitrogen atmosphere containing 5% v/v HCl for 5 min yields a 1.47 $\mu$m cross-linked polyvinylphenol film. The laminate thus obtained serves as the substrate 2 of which the polyvinylphenol coated side serves as the substrate surface on which subsequent layers are to be applied.

To 145 mg of the photochemical radical initiator 1-hydroxycyclohexyl phenyl ketone (tradename Irgacure 184, Ciba Geigy) is added 6 g of the conducting polyaniline solution prepared under A. After mixing well and sonifying twice for 1 min and cooling in between, the radiation-sensitive solution thus obtained is cooled and filtered (Millex FA, 1 $\mu$m). A radiation-sensitive layer is then formed by spin-coating (3 S/500 rpm, 7 s/2000 rpm) 1 ml of the radiation-sensitive solution onto the polyvinylphenolcoated surface of the substrate 2, and drying on a hot plate (2 min at 90° C.). The wafer is placed in a Karl Suss MJB3 aligner equipped with a 500 W Xe lamp and flushed with nitrogen for 3 min. A mask is brought into contact with the radiation-sensitive layer. The mask is constructed such that the electrically conducting area 3 will not be irradiated by the irradiation which is to follow. While continuously flushing with nitrogen, the radiationsensitive layer is irradiated via the mask with deep UV light (60 s, 20 mW/cm$^2$ at 240 nm), thereby forming a layer demonstrating a patchwork pattern of irradiated areas and non-irradiated areas, such as the electrically conducting area 3. The wafer is then heated on a hot plate (3 min at 110° C., 1 min at 150° C.) so as to remove the unreacted photochemical radical initiator. The patchwork patterned layer is now insensitive to the deep UV light used in the irradiation and substantially planar, the thickness of the irradiated areas being 0.25 $\mu$m, and of the non-irradiated areas 0.22 $\mu$m. The sheet resistance of the area 3 is 760 $\Omega$/square (conductivity 60 S/cm).

Immediately after having been filtered (Millex SR 0.5 $\mu$m), 3 ml precursor polythienylenevinylene solution prepared under B is spin-coated (3 s/500 rpm, 7 s/1000 rpm) onto the layer comprising the electrically conducting area 3. The precursor layer thus obtained is heated on a hot plate at 150° C. for 10 min in a nitrogen atmosphere containing HCl gas at a partial pressure of 2.3×10$^{-3}$ bar, thus causing the precursor layer to be converted into a 50 nm thick semiconducting area 4 comprising a polythienylenevinylene.

Subsequently, 3 ml of a cross-linkable composition, consisting of 4.0 g (0.034 mol) polyvinylphenol (Polysciences Inc., cat #6527) and 0.65 g (1.66 mmol) hexamethoxymethylenemelamine (Cymel 300 from Cyanamid) dissolved in 36 g propylene glycol methyl ether acetate (Aldrich), is spin-coated (3 s/500 rpm, 27 s/2500 rpm) onto the area 4 and dried at 110° C. for 1 min on a hot plate. Cross-linking at 125° C. in a nitrogen atmosphere containing 5% v/v HCl for 5 min yields a 0.27 $\mu$m cross-linked polyvinylphenol electrically insulating area 5. The dielectric constant of the cross-linked polyvinylphenol is 4.78 and its conductivity (at 1 kHz) 4.4×10$^{-11}$ S/cm.

Following the same procedure as that used for applying the electrically conducting area 3, only using a different mask, the second electrically conducting area 6 is provided on the area 5.

The laminate 1, the stack 10 and the vertical interconnect area 100 are now complete. The surface area of the vertical interconnect area measures 20 $\mu$m by 20 $\mu$m.
2) Notching the Vertical Interconnect Area:

The wafer comprising the laminate 1 is located in a wafer stage of a Model 7000 probing station equipped with a Model 512 manipulator which in turn is provided with a probe holder Model 77, all items manufactured by the Micromanipulator Company.

The probe holder holds a needle-shaped probe (Model 7C, the Micromanipulator Co.) having a tool tip indicated by the reference sign 20 in FIGS. 3 and 4. The tip radius 21 is 0.35 μm and the included angle 22 measures 14 degrees. The length of the tapered section is 0.64 mm.

The probe tip 20 is positioned opposite the vertical interconnect area 100. The situation shown in FIG. 3 has now been reached.

The probe tip 20 is then lowered onto the surface of the vertical interconnect area, using an angle of attack of 72 degrees from horizontal, and subsequently driven in by giving the lead screw on the manipulator one tenth of a turn. Subsequently, the tool tip 20 is retracted and the notch 104 is formed. The situation shown in FIG. 4 has now been reached.

When examined in plan view under a microscope, the notch 104 appears to be a black spot 15 to 20 μm in diameter. The resistance of the vertical interconnect thus obtained is 4 Ωg.

The method is repeated using a variety of tool tips having tip radii ranging from 0.5 to 50 μm, resulting in contact resistances of 3 to 5 Ωg. Using tungsten carbide tips of 5.0 μm tip radius, contact resistances of 3 to 12 kΩ are obtained.

Exemplary Embodiment 2

Figure 5:
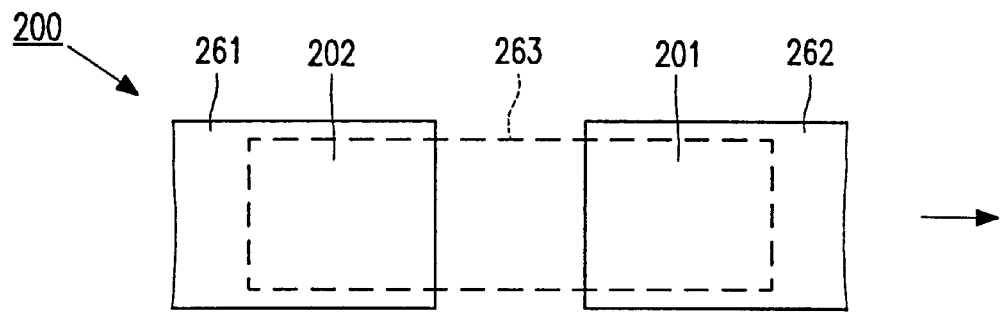

In order to test the reliability of the method in accordance with the invention, a test structure is manufactured of which a part is shown in FIG. 5.

FIG. 5 schematically shows a transparent plan view of a repeating unit of a chain of vertical interconnect areas suitable for use in the method in accordance with the invention.

The chain, indicated by reference sign 200, comprises 118 vertical interconnect areas of which only two, 201 and 202, are actually shown in FIG. 5. The chain 200 is obtained by repeating the repeating unit shown in FIG. 5 in a direction indicated by the arrow, in such a manner that the electrically conducting strips, such as the strips 261, 262 and 263, each are 60 μm long and 20 μm wide and the surface area of each vertical interconnect area measures 20 μm by 20 μm.

The structure of the chain thus obtained is such that an electrical connection between the ends of the chain is established only if all 118 vertical interconnects are provided successfully.

The chain 200 may be manufactured by following step 1) of the method in exemplary embodiment 1, with this difference that the masks are changed so as to provide the desired patterns for the manufacture of the chain 200.

The wafer comprising the chain 200 is then located in a wafer stage of a computer-controlled, motorized REL 6100 Alessi probing station equipped with an Alessi MS manipulator and a probe holder.

The probe holder holds a needle-shaped probe (Model 7B, the Micromanipulator Co.) having a tool tip which has a tapered section having a radius of 0.5 μm, an included angle of 19 degrees and a length of 1.5 mm.

Using the first vertical interconnect area, the down position of the probe necessary to obtain a vertical interconnect is then determined.

Using this down position and an angle of attack from horizontal of 85 degrees, all 118 vertical interconnect areas are notched one after the other in a single run.

In plan view, the notches appear as black spots having a diameter of 15 to 20 μm. As a rough indication of how far the tool tip may have penetrated the vertical interconnect area, it is noted that, using the tip properties mentioned above, the distance between the point of the tip and the location on its centre axis where the diameter of the tool tip is 15 μm, is about 42 μm.

The total resistance across the chain 200 is then measured and amounts to 370 kΩ, that is 3.15 kΩ per via. Since the resistance of a vertical interconnect area which has not been notched is more than 1 MΩ, this result demonstrates that all 118 vertical interconnects are formed successfully.

Exemplary Embodiment 3

Figure 6:
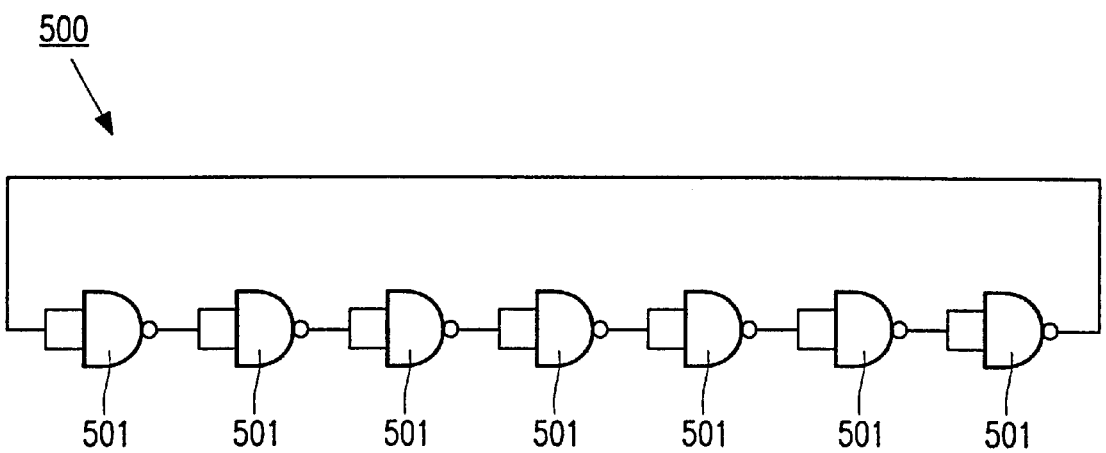
FIG. 6 shows a circuit diagram of a ring oscillator and a NAND logic gate.
Figure 6:
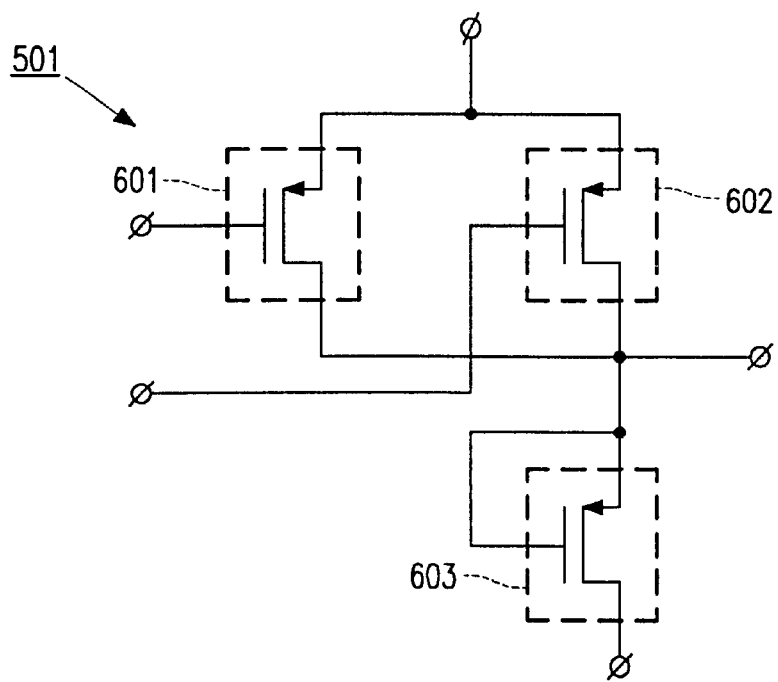

FIG. 6 shows a circuit diagram of a ring oscillator 500 comprising seven NAND logic gates 501. The NAND logic gate 501 comprises field-effect transistors 601, 602, and 603.

The ring oscillator is implemented using an integrated circuit consisting substantially of organic materials. The layout is such that the channel width of the transistors 601 and 602 is 0.25 mm and the channel width of transistor 603 is 1.5 mm, the channel length of 601 and 602 is 5 μm and the channel length of 603 is 5 μm. Furthermore, the layout is such that the source and drain terminals of all transistors, as well as the interconnects connecting said source and drain terminals, are all part of the same layer. The gate terminals of the field-effect transistors are part of a layer which is different from the layer comprising the source and drain terminals. Therefore, all interconnects between a gate and source or gate and drain terminal are vertical interconnects. Specifically, the gate terminal of field-effect transistor 603 is connected to its source terminal by means of a vertical interconnect. Also, each of the NAND gates 501 of the ring oscillator 500 is connected to its successor by means of a vertical interconnect.

Taking into account the layout considerations mentioned hereinabove, the integrated circuit may be manufactured by repeating the method of exemplary embodiment 1, with this difference that, along with the vertical interconnect areas, the organic field-effect transistors are provided. This is simply accomplished by using different masks. The first mask defines, besides the first electrically conducting area of each vertical interconnect area, the source and drain terminals of the field-effect transistors as well as the interconnect interconnecting said terminals. The second mask defines the second electrically conducting area of each via, the gate terminals and the gate to gate interconnects.

The integrated ring oscillator thus obtained is then connected to a power source and a voltage of −5 V is applied. The output signal is recorded.

Figure 7:
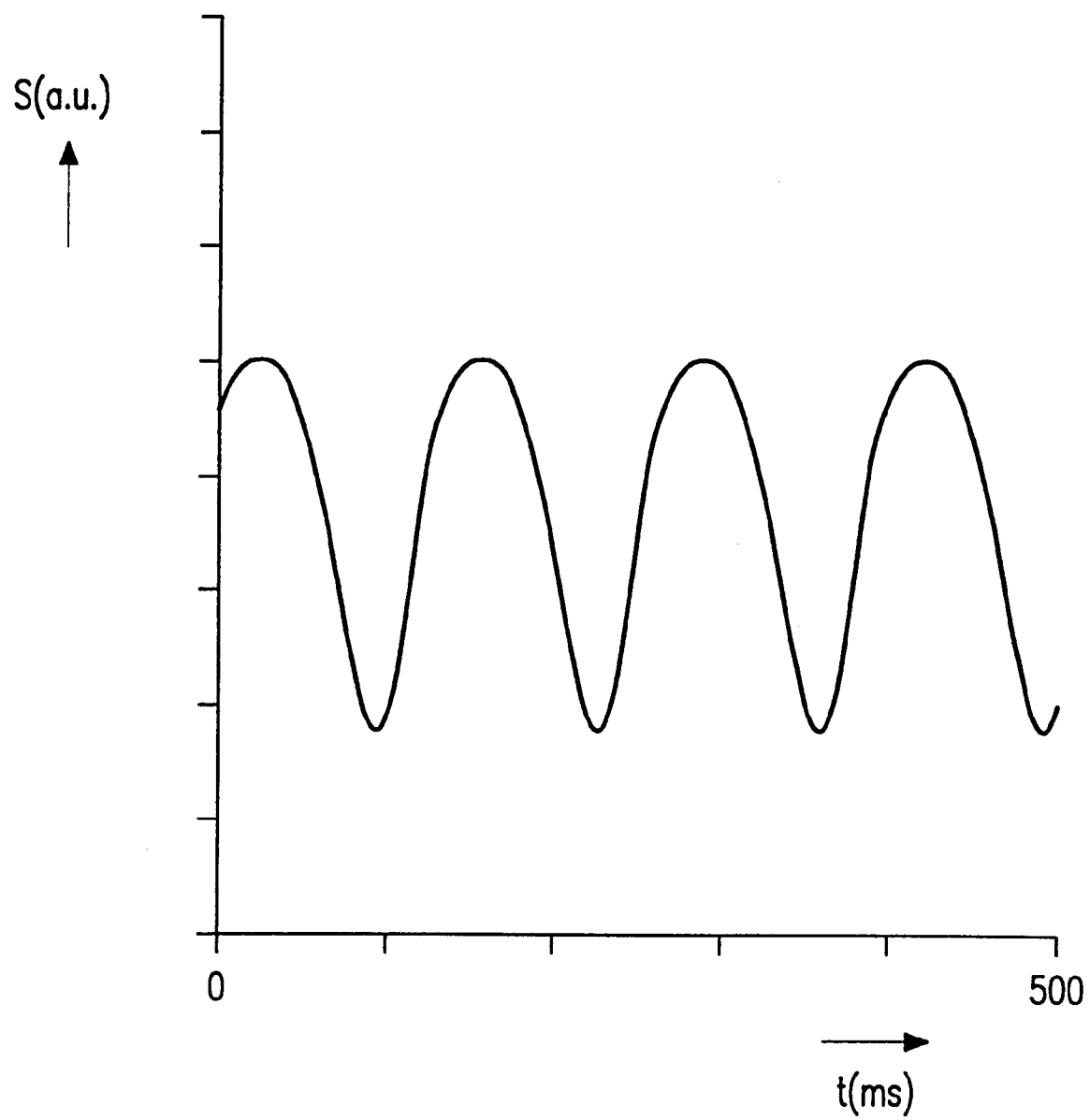
FIG. 7 shows a diagram of an output signal S (in arbitrary units a.u.) as a function of time t (in ms) of the ring oscillator implemented on an integrated circuit in accordance with the invention.

FIG. 7 shows a diagram of the output signal S (in arbitrary units a.u.) as a function of time t (in ms) of the ring oscillator 500. The signal oscillates with a frequency of 7.5 Hz.

Examples of other integrated circuits consisting substantially of organic materials which have been made using similar methods, are invertors, AND logic gates and frequency dividers.

What is claimed is:

1. A method of providing a vertical interconnect between a first and a second thin-film microelectronic device, said method comprising the steps of:
    (a) providing a vertical interconnect area,
        said vertical interconnect area being an area of overlap of a stack of a first organic electrically conducting area, an organic electrically insulating area and a second organic electrically conducting area,
        said first organic electrically conducting area being electrically connected to a terminal of said first microelectronic device, said second organic electrically conducting area being electrically connected to a terminal of said second microelectronic device, and (b) notching the vertical interconnect area using a tool tip, thereby forming the vertical interconnect.

2. A method of providing a vertical interconnect between a first and a second thin-film microelectronic device, said method comprising the steps of:

(a) providing a vertical interconnect area, said vertical interconnect area being an area of overlap of a stack of a first organic electrically conducting area, an organic electrically insulating area and a second organic electrically conducting area, said first organic electrically conducting area being electrically connected to a terminal of said first microelectronic device, said second organic electrically conducting area being electrically connected to a terminal of said second microelectronic device, and (b) notching the vertical interconnect area using a tool tip, thereby forming the vertical interconnect, said tool tip being a tapered tool tip having a tip radius between 0.1 µm and 5.0 µm.

3. A method as claimed in claim 2, wherein said tool tip is applied at a right angle from the horizontal.

4. A method as claimed in claim 2, wherein said tool tip is wedge-shaped.

5. A method as claimed in claim 2, wherein said tool tip is needle-shaped.

6. A method of providing a vertical interconnect between a first and a second thin-film microelectronic device, said method comprising the steps of:

(a) providing a vertical interconnect area, said vertical interconnect area being an area of overlap of a stack of a first organic electrically conducting area, an organic electrically insulating area and a second organic electrically conducting area, said first organic electrically conducting area comprising an electrically conducting polyaniline electrically connected to a terminal of said first microelectronic device, said second organic electrically conducting area comprising an electrically conducting polyaniline electrically connected to a terminal of said second microelectronic device, and (b) notching the vertical interconnect area using a tool tip, thereby forming the vertical interconnect.

7. A method as claimed in claim 6, wherein said tool tip is wedge-shaped.

8. A method as claimed in claim 6, wherein said tool tip is needle-shaped.

9. An integrated circuit consisting essentially of organic materials and comprising at least one vertical interconnect comprising a notch in an area of overlap of a stack of a first organic electrically conducting area, an organic electrically insulating area and a second organic electrically conducting area, wherein the first organic electrically conducting area is electrically connected to a terminal of a first microelectronic device, and the second organic electrically conducting area is electrically connected to a terminal of a second microelectronic device.

10. An integrated circuit consisting essentially of organic materials and comprising a vertical interconnect comprising a notch in a vertical interconnect area, said vertical interconnect area being an area of overlap of a stack of a first organic electrically conducting area, a second organic electrically conducting area and an intermediate organic electrically insulating area, said first electrically conducting area being electrically connected to a terminal of a first thin-film microelectronic device, and said second electrically conducting area being electrically connected to a terminal of a second thin-film microelectronic device.

* * * * *